(12) United States Patent
Ogura et al.

(10) Patent No.: US 6,998,658 B2
(45) Date of Patent: Feb. 14, 2006

(54) TWIN NAND DEVICE STRUCTURE, ARRAY OPERATIONS AND FABRICATION METHOD

(75) Inventors: Seiki Ogura, Hopewell Junction, NY (US); Tomoko Ogura, Hopewell Junction, NY (US); Tomoya Saito, Beacon, NY (US); Kimihiro Satoh, Hopewell Junction, NY (US)

(73) Assignee: Halo LSI, Inc., Hillsboro, OR (US)

( * ) Notice: Subject to any disclaimer, the term of this patent is extended or adjusted under 35 U.S.C. 154(b) by 88 days.

(21) Appl. No.: 10/697,925

(22) Filed: Oct. 30, 2003

(65) Prior Publication Data

US 2004/0087087 A1    May 6, 2004

Related U.S. Application Data

(62) Division of application No. 10/218,210, filed on Aug. 13, 2002, now Pat. No. 6,670,240.

(60) Provisional application No. 60/311,879, filed on Aug. 13, 2001.

(51) Int. Cl.
*H01L 29/76*    (2006.01)
*H01L 29/94*    (2006.01)
*H01L 31/062*   (2006.01)
*H01L 31/113*   (2006.01)
*H01L 31/119*   (2006.01)

(52) U.S. Cl. ................. 257/288; 257/296; 257/324
(58) Field of Classification Search ............ 257/288, 257/296, 301, 302, 312, 314, 315, 324, 906

See application file for complete search history.

(56) References Cited

U.S. PATENT DOCUMENTS

| 4,943,943 | A  |   | 7/1990  | Hayashi et al. ............. 365/185 |
| 5,768,192 | A  |   | 6/1998  | Eitan ..................... 365/185.24 |
| 5,851,881 | A  | * | 12/1998 | Lin et al. .................... 438/261 |
| 6,166,410 | A  | * | 12/2000 | Lin et al. .................... 257/324 |
| 6,686,632 | B1 | * | 2/2004  | Ogura et al. ................ 257/374 |

FOREIGN PATENT DOCUMENTS

| JP | 11-22940  | 12/1997 |
| JP | 00-31435  | 7/1998  |

OTHER PUBLICATIONS

F. Masuoka et al., "A New NAND Cell for Ultra High Density 5V-Only EEPROMS," May 1988, Proc. 1988 Symp. on VLSI Tech, IV-5, pp. 33-34.

* cited by examiner

*Primary Examiner*—David Nhu
(74) *Attorney, Agent, or Firm*—George D. Saile; Stephen B. Ackerman

(57) ABSTRACT

A method for making a twin MONOS memory array is described where two nitride storage sites lay under the memory cell word gate. The fabrication techniques incorporate self alignment techniques to produce a small cell in which N+ diffusion the nitride storage sites are defined by sidewalls. The memory cell is used in an NAND array where the memory operations are controlled by voltages on the word lines and column selectors. Each storage site within the memory cell is separately programmed and read by application of voltages to the selected cell through the selected word line whereas the unselected word lines are used to pass drain and source voltages to the selected cell from upper and lower column voltages.

10 Claims, 12 Drawing Sheets

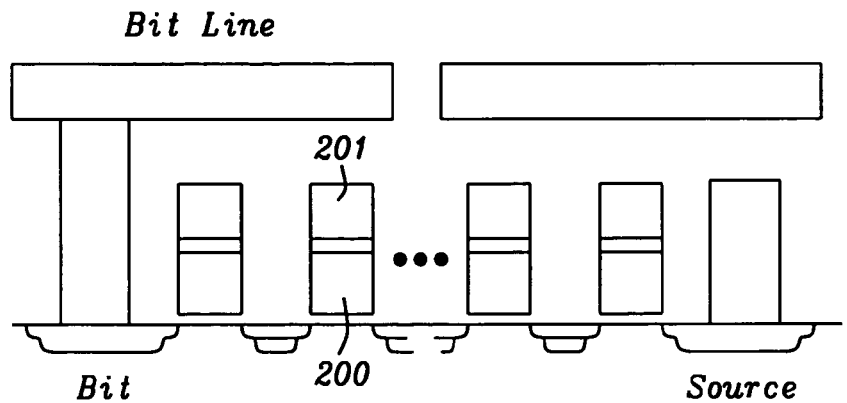
FIG. 1A – Prior Art
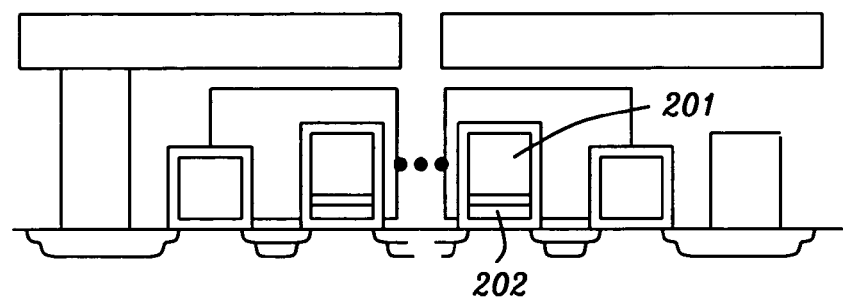
FIG. 1B – Prior Art
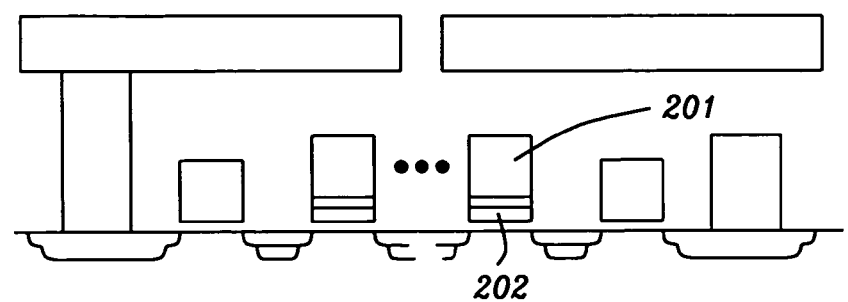
FIG. 1C – Prior Art

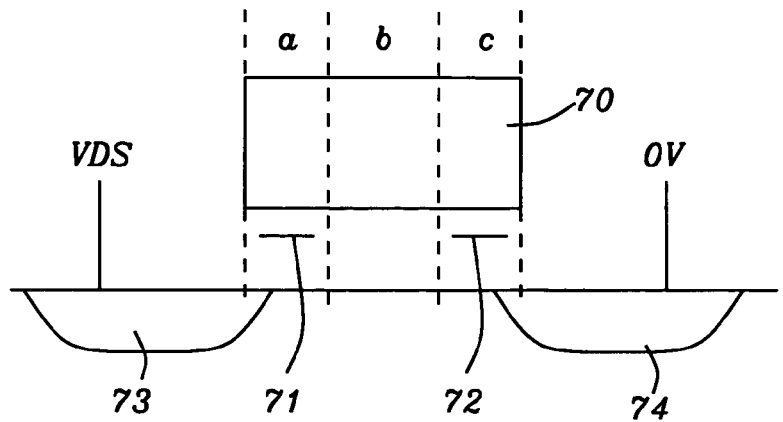
FIG. 6A
| Region | a | b | c | Net Vt@ VDS=1V |
|---|---|---|---|---|
| (i) | 0.5 | 0.5 | 0.5 | 0.5 |
| (ii) | 0.5 | 0.5 | 0.5 | 0.5 |
| (iii) | 0.5 | 0.5 | 1.5 | 1.5 |
| (iv) | 1.5 | 0.5 | 1.5 | 1.5 |
FIG. 6B
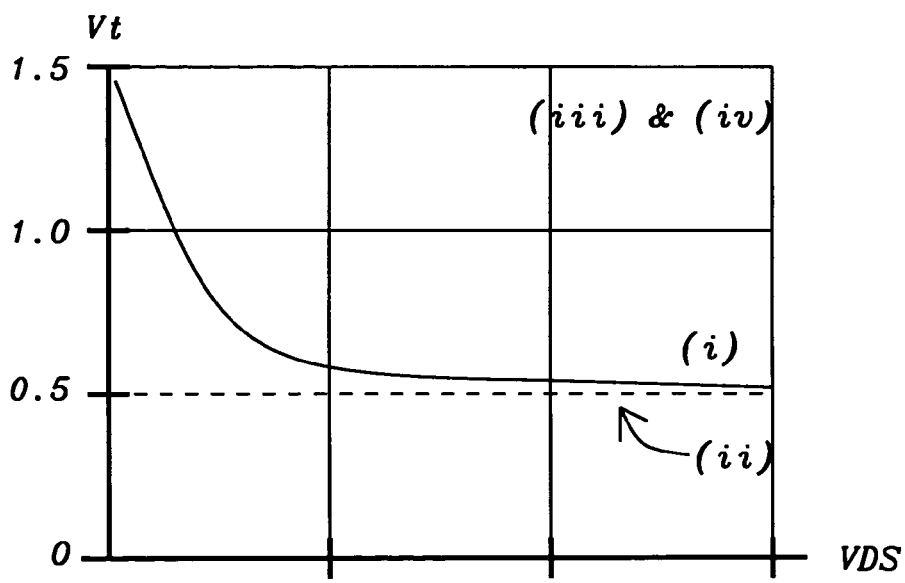
FIG. 6C

TWIN NAND DEVICE STRUCTURE, ARRAY OPERATIONS AND FABRICATION METHOD

This is a division of patent application Ser. No. 10/218,210, filing date Aug. 13, 2002 now U.S. Pat. No. 6,670,240, Twin Nand Device Structure, Array Operation And It Fabrication Method, assigned to the same assignee as the present invention.

This application claims priority to Provisional Patent Application serial No. 60/311,879, filed on Aug. 13, 2001, which is herein incorporated by reference

BACKGROUND OF THE INVENTION

1. Field of Invention

The present invention is related to semiconductor memory and more particular non-volatile NAND memory arrays.

2. Description of Related Art

In F. Masuoka et al., "A New NAND Cell for Ultra High Density 5V-only EEPROMs", May 1988, Proc 1988 Symposium on VLSI Technology, IV-5 pp33–34) a floating gate NAND cell, shown in FIG. 1A of prior art, is described that has been used widely as Non-volatile memory. Since the memory cell is placed in series without any contact, the density is very high even though the process complexity is high and the read current level is very small. The storage element in the flash NAND is a polysilicon floating gate 200 residing under a word line 201 in the example shown in FIG. 1A. The floating gate can be replaced by a nitride layer sandwiched between bottom and top oxide layers (Oxide-Nitride-Oxide) 202 laying under a word gate 201 as shown in the example in FIG. 1B and FIG. 1C of prior art. The ONO layer sandwich stores electron or hole charges in the nitride or interface trap sites as suggested in Y. Hayashi et al. "Nonvolatile Semiconductor memory and its Programming Method", JP 11–22940, Dec. 5, 1997. This ONO storage approach for the MONOS NAND simplifies the process significantly compared to the floating gate approach. The floating gate NAND utilizes multi-level storage and provides density factor at least 2 times, whereas a the twin MONOS device of the present invention improves density by storing charges on both device edges in a single planar FET devices. In U.S. Pat. No. 5,768,192 (Eitan) a non-volatile semiconductor memory cell utilizing asymmetrical charge trapping is disclosed. However, the memory cell device suffers from a threshold shift after many program and erase cycles because the electron mean free path is larger than hole mean free path. In U.S. Pat. No. 4,943,943 (Hayashi et al.) a read-out circuit for a semiconductor nonvolatile memory is described which is capable of extracting a widely fluctuating output voltage using a reverse read.

In the present invention, the nitride storage element under the word gate is very small and well defined so that the hole injection for program is applicable over the whole nitride storage region. Erase is achieved by FN (Fowler-Norheim) electron injection, and once the nitride region is limited and optimized, then the voltage required for hole injection can be almost halved. By introducing a trap free oxide region between the two nitride storage sites, the threshold instability from program and erase cycles due to the miss match of hole and electron mean free paths is solved assuring high endurance. The voltage reduction in FN injection is achieved by reducing nitride thickness down to few atomic layers. Thus a low voltage and high density operation is achieved for the MONOS NAND structure of the present invention.

SUMMARY OF THE INVENTION

It is an objective of the present invention to provide a twin MONOS memory cell where the two storage sites are beneath a word gate.

It is another objective of the present invention to couple cells in a column together with diffusions located between memory cells.

It is still another objective to isolate cells between columns with a shallow trench isolation.

It is also another objective of the present invention to use the twin MONOS memory cell with two storage sites beneath the word gate in a NAND memory array.

It is yet an objective of the present invention to erase and program the storage sites using electron injection with FN tunneling and hot hole injection with band to band tunneling, respectively.

It is also yet an objective of the present invention to sequentially read odd (or even) storage sites on a column.

It is still yet an objective of the present invention to erase by block, program and read by storage cell.

A twin MONOS NAND memory array is produced where the memory cell contains two storage sites located below a word gate. Exclusive of column select, column voltages and word line voltages, no other controls are required to control memory operations. Unselected word lines are used to pass upper and lower column voltages to source and drain of the selected cell. The voltages on the source and drain of each cell along with the word gate voltage control the memory operations of each cell.

The twin MONOS memory cells are constructed on a P-type well by establishing blocks of $SiO_2$ under which N-type regions were previously implanted. The N-type region comprises a lightly doped area within which is a heavily doped area. Silicon nitride deposited on the walls of the blocks and the area between blocks is masked by disposable sidewalls and etched to leave an "L" shaped element on adjacent sides of the blocks. The foot of the "L" silicon nitride shape that extends part way into the area between the $SiO_2$ blocks is used as the storage sites for the twin MONOS memory cell. The SiN can be another insulator material different from the bottom and top insulator such as $Ta_2O_5$ and $Zr\ O_2$ etc. The objective is to create trap sites for electron and hole storage at different insulator interfaces. A polysilicon layer is deposited in the region between blocks and over the "L" shaped silicon nitride. The polysilicon layer forms a word gate for the memory cell and is continuous over the width of the memory array becoming a word line. The diffusion areas under the $SiO_2$ connect memory cells in a column together, providing a drain for one cell and a source for the adjacent cell.

Alternative fabrication method after defining the $SiO_2$ block is also provided. ONO(Oxide-Nitride-Oxide) and polysilicon are subsequently deposited on the walls of the blocks. The area between blocks is masked by sidewall polysilicon and etched to leave an "L" shaped ONO element on adjacent sides of the blocks. The foot of the "L" shaped ONO that extends part way into the area between the $SiO_2$ blocks is used as the storage sites for the twin MONOS memory cell. A gate oxide is grown on the exposed substrate between the L shapes. The oxide is also grown on the polysilicon sidewalls. A polysilicon layer is deposited in a trench between the polysilicon sidewalls and recessed to expose and remove the oxide on the polysilicon sidewalls. The polysilicon sidewall gates facing each other are connected by a tungsten stud process, which forms a word gate for the memory cell.

At the top and bottom of each column are upper and lower selector gates that select even or odd columns with voltages required to open or close the gates. With an upper and lower column voltage selected by the upper and lower selector gates, the unselected word lines bias the unselected memory cells to pass the upper and lower column voltages to the drain and source of the selected memory cell. Thus the combination of the voltage on the selected word line and the upper and lower column voltages passed by the unselected word lines, the selected storage site within a memory cell is read and programmed, and both storage sites of a block of memory cells are erased.

The memory density is doubled as compared to conventional floating gate devices because there are two storage elements under a single word gate. A shorter and thinner high voltage device is produced, which solves scaling and performance issues. Program and erase voltage reduction is possible as a result of not having to consider coupling ratios. Process simplicity is a result of to eliminating floating gate elements and by the method used to produce the twin storage sites. The nitride under the word gate can be continuous, but extra electrons are trapped at the middle of the channel if holes do not reach the center of the channel due to the short mean free path. This causes the center threshold to gradually get high after many program and erase cycles. This threshold instability due to uncontrolled electron charge at the middle of the channel is eliminated by separating the nitride layer at the middle and by providing charge trap free oxide in the middle of the channel. The controlled short storage elements allow a large threshold voltage fall off in forward read operations, and the large Vt fall off may extend the use of multi-level storage in the reverse read mode.

BRIEF DESCRIPTION OF THE DRAWINGS

This invention will be described with reference to the accompanying drawings, wherein:

FIG. 1A shows a diagram of a portion of a floating gate NAND memory array of prior art, FIGS. 1B and 1C shows a diagram of a portion of a floating gate NAND memory array where the floating gate area is constructed using an ONO region under the control gate, FIG. 6A shows a diagram of three device components in a single memory cell of the present invention, FIG. 6B shows a table of possible threshold conditions in the three devices in a single memory cell including the net threshold of the combined memory cell, FIG. 6C shows the threshold behavior of a memory cell for different memory storage states provided in FIG. 6B.

DETAILED DESCRIPTION OF THE PREFERRED EMBODIMENT

Figure 2:
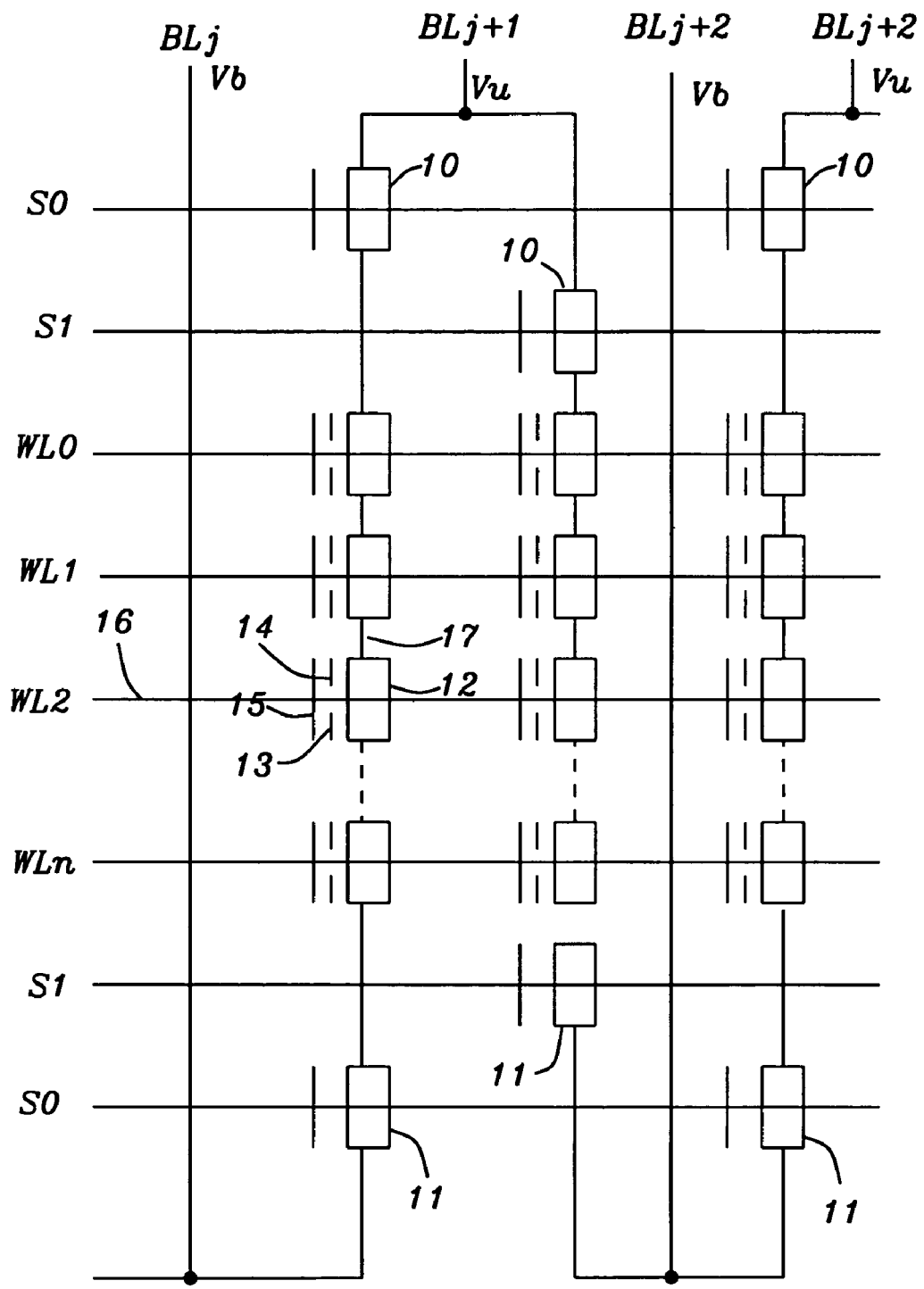
FIG. 2 shows a schematic diagram of a twin MONOS NAND memory array of the present invention.

In FIG. 2 is shown two columns of an NAND array using the twin MONOS memory cells of the present invention. At the top of each column are selector gates 10 that connect an upper column voltage Vu to a column of memory cells. At the bottom of each column are selector gates 11 that connect a bottom voltage Vb to a column of memory cells. A selector voltage S0 selects the selector gates for a first column and selector S1 selects the voltages for a second memory column. Each memory cell 12 is constructed with two storage sites 13 and 14 under a word gate 15. The word gates of a row of memory cells are connected together with a word line 16. Memory cells in a column are connected together by an N-type diffusion in a P-type substrate. The array can also be made on an N-type substrate where the diffusions connecting together cells in a column would be a P-type substrate or a P-Well.

Figure 3A:
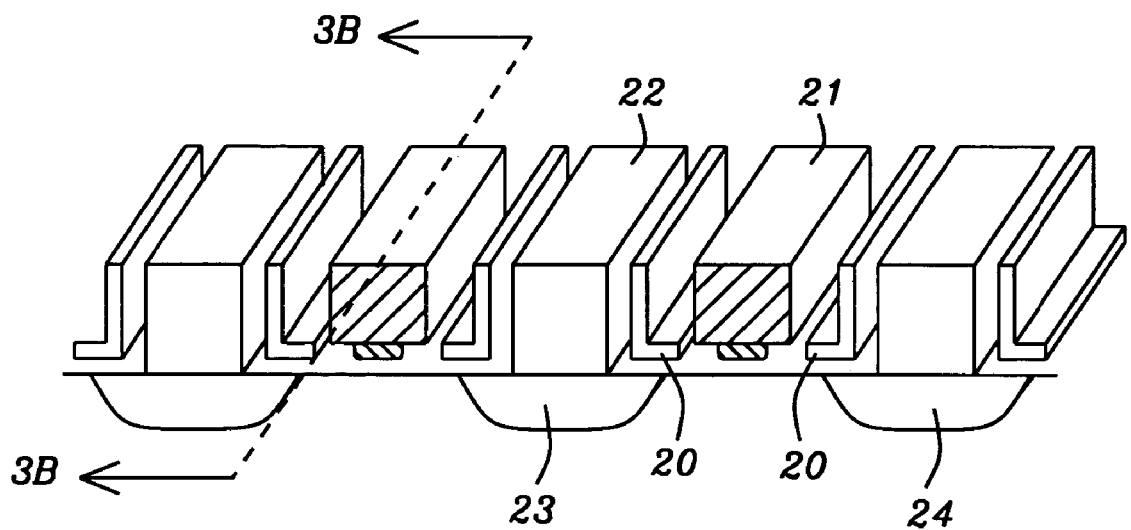
FIGS. 3A and 3B show diagrams of the memory array structure of the present invention.
Figure 3B:
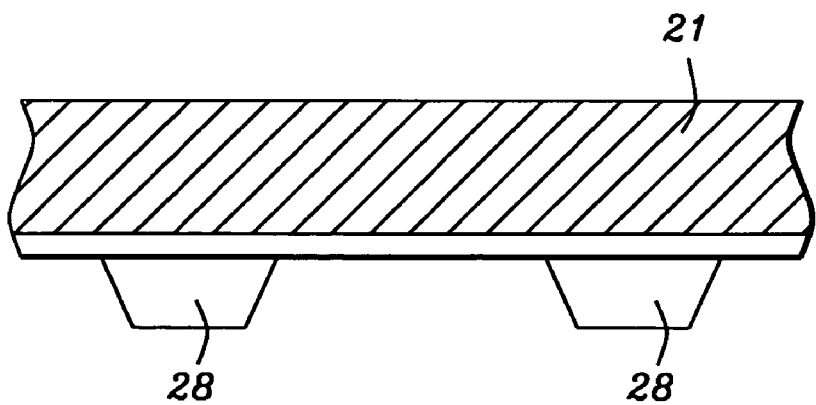

FIG. 3A shows a cross sectional diagram of a portion of a column of memory cells of the present invention. The "L" shaped nitride elements 20 lay between the polysilicon word lines and the oxide insulator blocks 22. The feet of the "L" shaped nitride lay under the word gate 21 and provide storage sites for the twin MONOS memory cells where the nitride layer can be replaced by other insulators having lower energy gap than that for silicon dioxide. Below each oxide block 22 lay an N-type diffusion 23. The diffusion 23 and the adjacent diffusion 24 provide a source and a drain for a memory cell constructed of the two "L" shaped nitride elements 20 and the word gate that is a part of the word line 21. FIG. 3B shows shallow trench isolation 28 that lies between columns to separate the cells in adjacent columns.

Continuing to refer to FIG. 3A, under each word gate 21 and at edges of the diffusions 23 and 24, a short and thin nitride foot of the "L" shaped element 20 is placed to provide charge storage having approximately about 20–40 nm in length and thickness ranging from a few atomic layers to 15 nm. The middle of the word gate 21 does not have an underlying nitride region and the gate oxide thickness under the polysilicon word gate 21 is approximately about 8–12 nm. The oxide under the nitride foot region 20 is approximately about 2.5–5 nm, and the nitride foot thickness is approximately about 2.5–5 nm. The top oxide over the nitride layer 20 is needed to block electrons injected by FN tunneling from the bottom silicon; therefore, the top oxide should be slightly thicker than the bottom oxide.

Figure 4A:
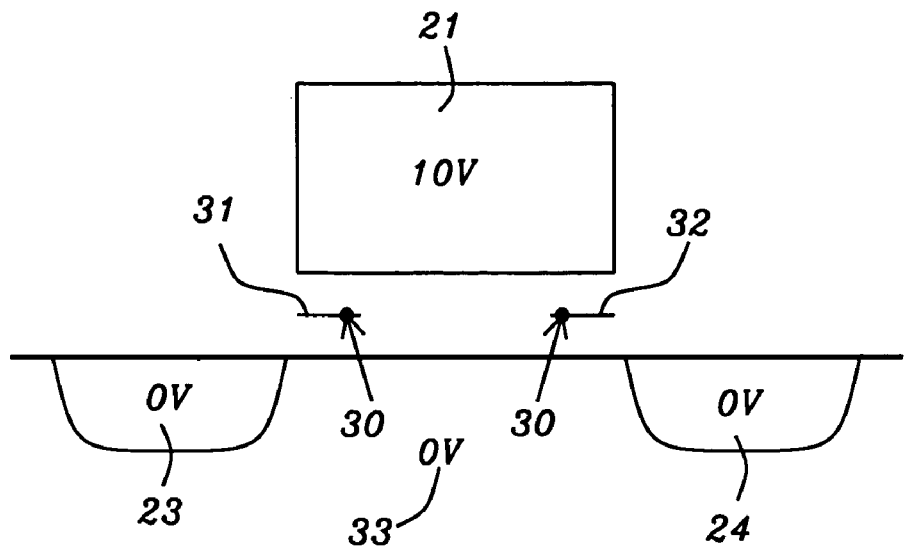
FIG. 4A shows a diagram for an erase operation of a memory cell of the present invention, where device 31 and 32 are both charged with electrons by FN tunnel injection.

In FIG. 4A is shown a diagram demonstrating an erase operation. In an erase operation electrons are injected 30 into the nitride layers 31 and 32 by FN tunneling with a positive voltage approximately about 10V on the word gate 21 and 0V on the diffusions 23 and 24 and the substrate 33. The 10V between the word gate 21, and silicon substrate 33 and diffusions 23 and 24 can be proportioned such that 6V is on the word gate and 4V on the silicon substrate. Both storage nitride elements 31 and 32 under each word gate are injected and filled with electrons simultaneously.

Figure 4B:
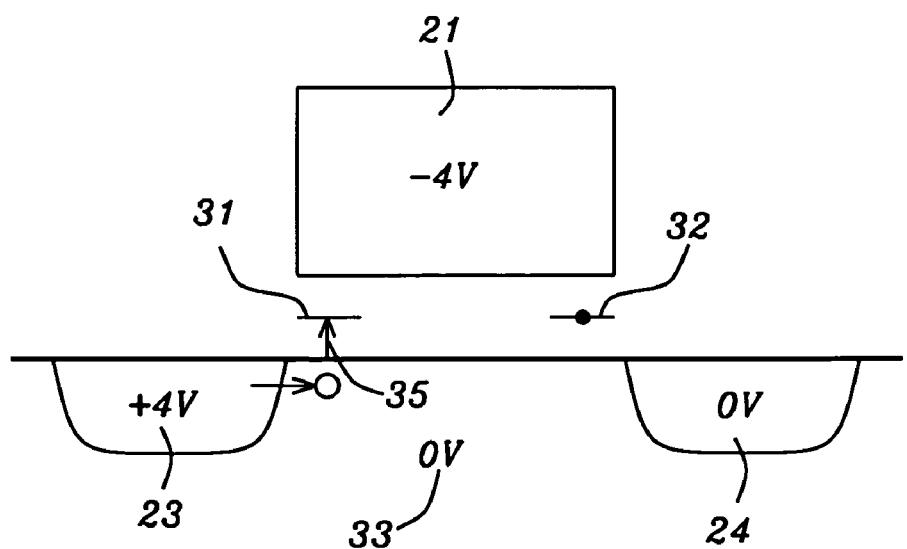
FIG. 4B shows a diagram for a program operation of a memory cell of the present invention, where a device is programmed by hot hole injection generated by band to band tunneling.

In FIG. 4B is shown a diagram demonstrating a program operation. A program operation is defined as an electron ejection 35 or hole injection with a negative bias of approximately about (−−2 to −5V) on the selected word gate 21 and positive bias of approximately about (4 to 5V) on the diffusion 23 under the selected storage site 31. Under this bias condition, the slightly inside of N-junction 23 is depleted by the negative word gate voltage and holes 35 are generated by band to band tunneling. The holes are accelerated by the potential between the drain voltage and the substrate, and injected into the storage node 31 in FIG. 4B through the bottom oxide if the hole energy is higher than the oxide barrier height. The diffusion 24 under the unselected storage site 32 is biased to ground. Since the negative gate bias provides an off state in the N-channel device, one diffusion 23 in the transistor can be a high voltage and the other diffusion 24 can be ground without channel current. Thus stored electrons in only one of the storage sites 31 and 32 under each word gate can be ejected by selecting a positive voltage on diffusion 23 without affecting the other storage site with hole injection. It should be noted that the voltage conditions among the nodes in FIGS. 4A and 4B are relative to one another.

Figure 5A:
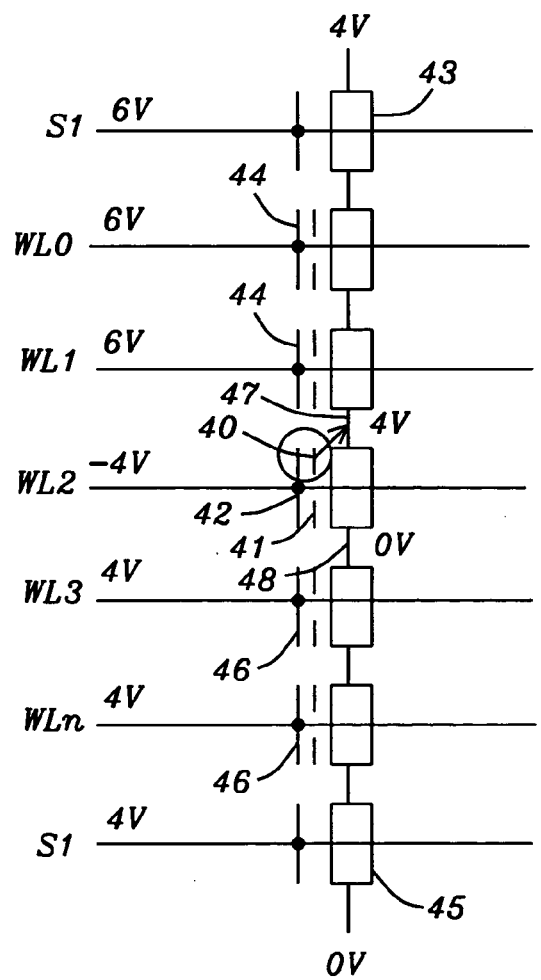
FIG. 5A shows a schematic diagram for a program operation of a selected cell in the memory array of the present invention.

In FIG. 5A is shown a schematic diagram demonstrating a programming operation on a selected storage site 40, which is circled. In this demonstration, the selected storage site to be programmed and eject electrons is the upper storage site 40 and the unselected storage site is the lower storage site 41. Both the upper and lower storage sites reside under the selected word gate 42 where the word gate is biased to approximately about a negative 4 volts. The drain of select transistor 43 is biased to approximately about a positive 4V. The select transistor drain bias of 4 Volts is passed to the diffusion 47 under the selected storage site 40 by applying sufficient voltage of approximately about 6V on the gate of the upper select transistor 43 and the unselected word gates 44. A ground potential is applied to the source of the bottom select transistor 45, which is connected to the diffusion 48 under the unselected storage site 41 when gate of the bottom select transistor and the unselected word gates 46 are biased to a few volts above ground (arbitrarily chosen to be 4 volts for this demonstration). The application of the higher voltage on the upper unselected word gates 44 is slowly ramped in order to minimize electron injection into the nitride under an unselected word gate, which may occur when the diffusion nodes are at an initial 0V.

Figure 5B:
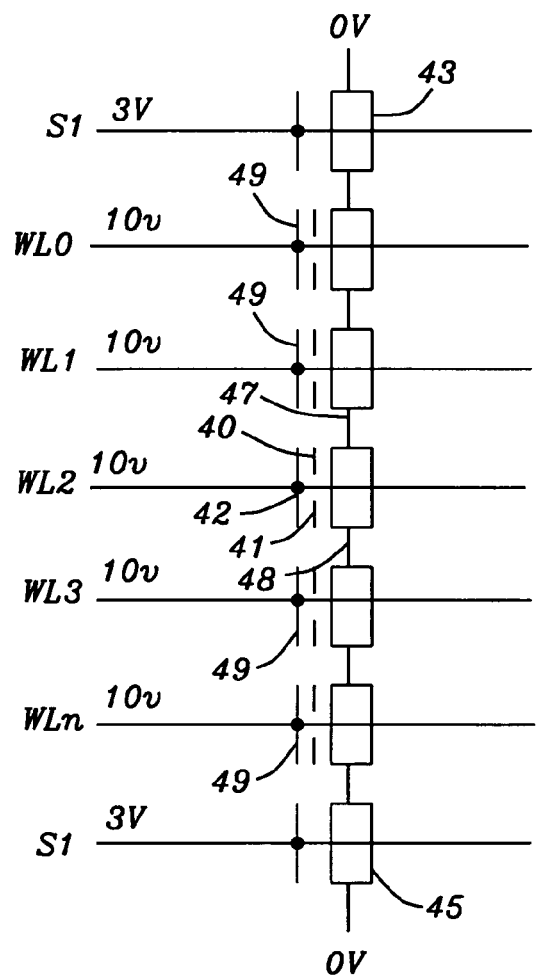
FIG. 5B shows a schematic diagram for an erase operation of a block of cells in the memory array of the present invention.

In FIG. 5b is shown a schematic diagram demonstrating an erase operation on a portion of a block of memory cells. The upper and lower selected transistors are selected with a select voltage of 3V allowing the ground potential on the bit lines to be passed to the memory cells in the column. A high voltage (+10V) is applied to the word gates 49 of each memory cell. In the erase operation electrons are injected into the nitride layers, typified by 40 and 41, by FN tunneling with the positive word gate voltage of approximately about 10V and 0V on the diffusions 47 and 48 and the substrate. Both storage nitride elements 40 and 41 under each word gate are injected and filled with electrons simultaneously.

Referring to FIG. 6A, a twin MONOS memory cell of the present invention is shown with a word gate 70, two nitride storage sites 71 and 72, a drain 73 and a source 74. Three voltage regions (a), (b) and (c) are shown which traverse the channel under the word gate. A voltage VDS is applied to the drain 73 with the source connected to ground. When some electrons have been stored in the drain side nitride storage site 71, the Vt of region (a) is increased to 1.5V from 0.5V. When a voltage of about 1V is applied to the drain, the Vt towards the drain 73 is reduced to a Vt of approximately 0.5V from 1.5V since the depletion region extends beyond the short (approximately 20–30 nm) nitride region 71, while the Vt of the source side 72 is unaffected and controls the channel current.

In FIG. 6B is shown values for Vt in regions (a), (b) and (c). For condition (i), all of the Vt in the region (a), (b) and (c) are 0.5V, then the net Vt of the three combined devices in series is 0.5V. For condition (ii), where there is a charge on the drain side storage site on 71, there is about 1.5V at low drain voltage. However, as the drain voltage increases, the net threshold voltage decreases quickly from 1.5V to 0.5V as shown in FIG. 6C due to the drain depletion extension beyond the nitride layer. For condition (iii) and (iv), when there is stored charge on the source side storage 72 in FIG. 6A, the drain voltage does not easily affect the source device and the net Vt of the memory cell determined by the source side Vt of 1.5V. This means that when small voltage, as 1.5V, is applied to the drain, the memory state in short channel device 71 at the drain can be ignored and the memory state of the source side device 72 can be correctly read even if the channel is extremely short.

Figure 7:
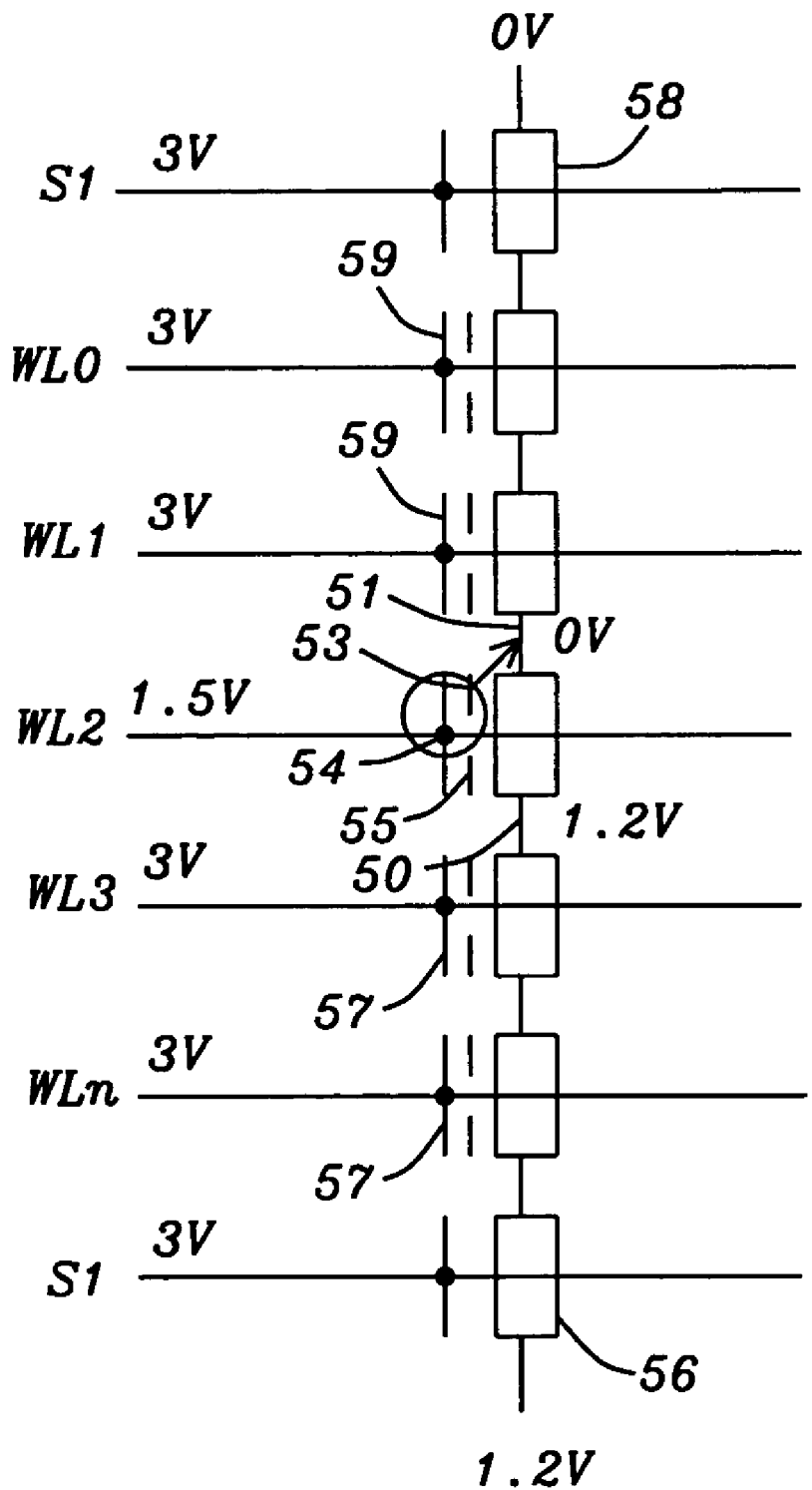
FIG. 7 shows a schematic diagram for a read operation of a selected cell in the memory array of the present invention.

Referring to FIG. 7, a schematic diagram of the present invention is shown demonstrating a read operation. When the selected storage site 53 is read, the selected word gate 54 is biased to about 1.5V near the programmed threshold voltage. The bottom diffusion 50 used as the drain is biased to approximately about 1.2V and the top diffusion 51 is biased to ground. The Vt of the bottom storage site 55 is reduced below 0.5V by the voltage (1.2V) of the drain 50 even when electrons are stored in the nitride storage site 55. If the top nitride storage site 53 is charged with electrons making the Vt near the upper diffusion 51 approximately 1.5V, there is no current flow. If the upper storage site 53 is not charged and has a low Vt, channel current will flow. Thus, the state of charge on the upper storage site 53 is determined by measuring the column current.

Continuing to refer to FIG. 7, the 1.2V connected to the bottom diffusion 50 is obtained by biasing the source of the bottom select transistor 56 to approximately 1.2V. The unselected word gates 57 are biased to approximately 3V to pass the 1.2V to the bottom diffusion 50. The source of top select transistor 58 is biased to ground and the unselected word gates 59 are biased to approximately 3V to pass the ground potential to the upper diffusion 51. When the bottom storage site 55 is read, the voltages connected to the select transistors 56 and 58 are reversed so that 1.2V is applied to the top select transistor 58 and ground is applied to the bottom select transistor 56. The drain voltage of approximately 1.2 V is then applied to the top diffusion 51 through the top select transistor 58, and the bottom diffusion 50 is biased to ground through the bottom select transistor 56.

Figure 8A:
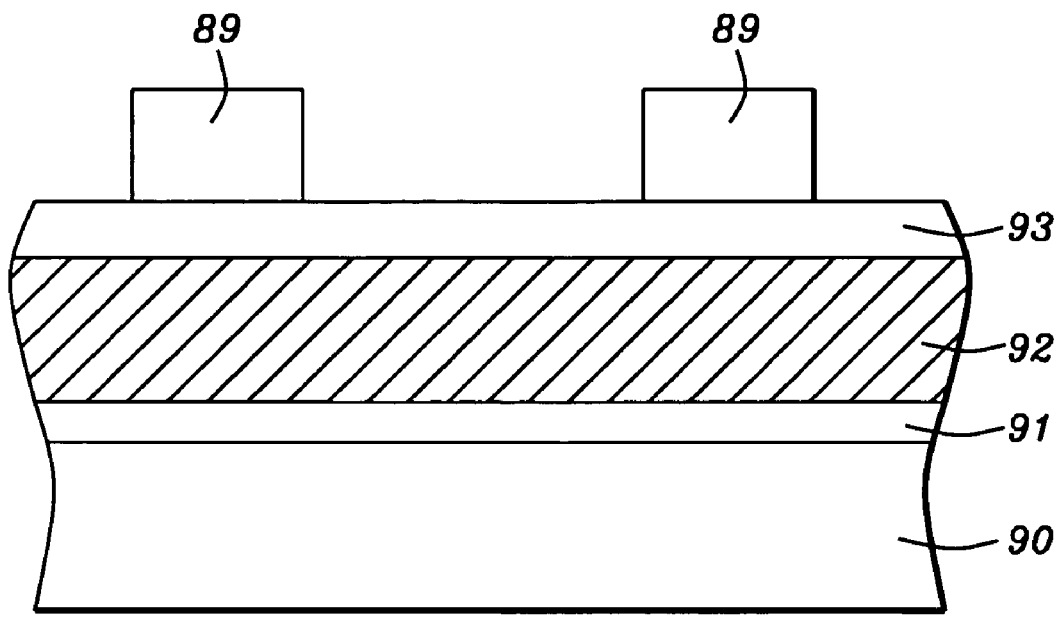
FIG. 8A through 8I show process steps to produce the twin MONOS memory cell of the present invention.
Figure 8B:
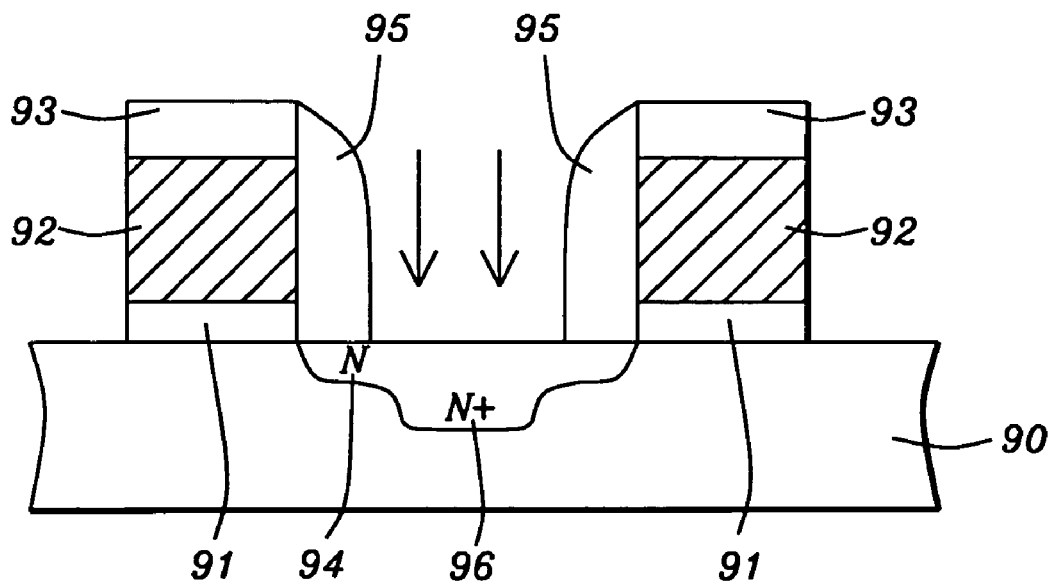
Figure 8C:
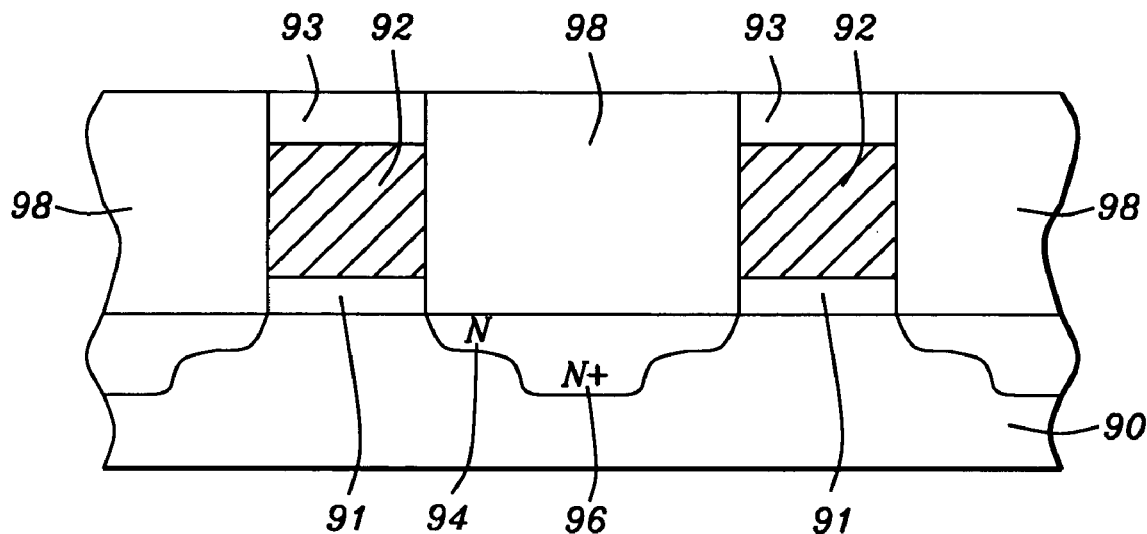
Figure 8D:
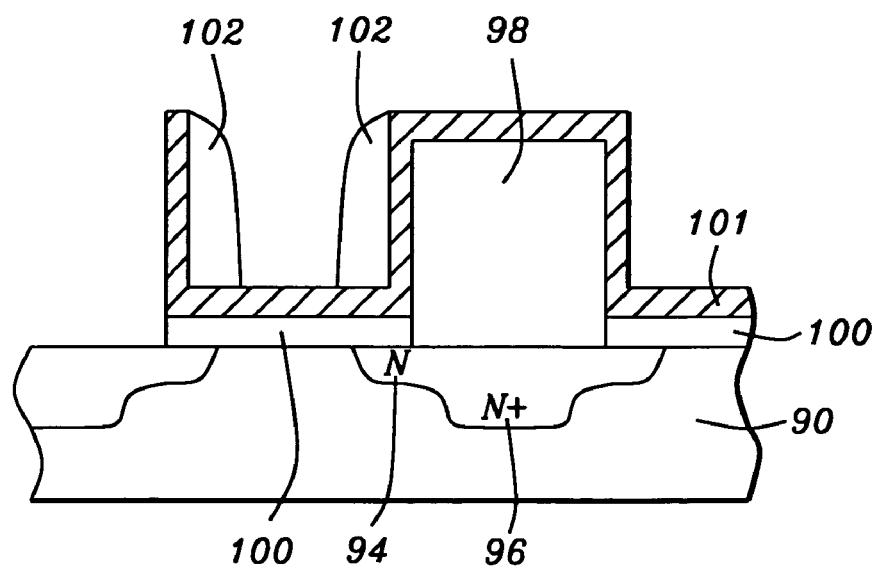
Figure 8E:
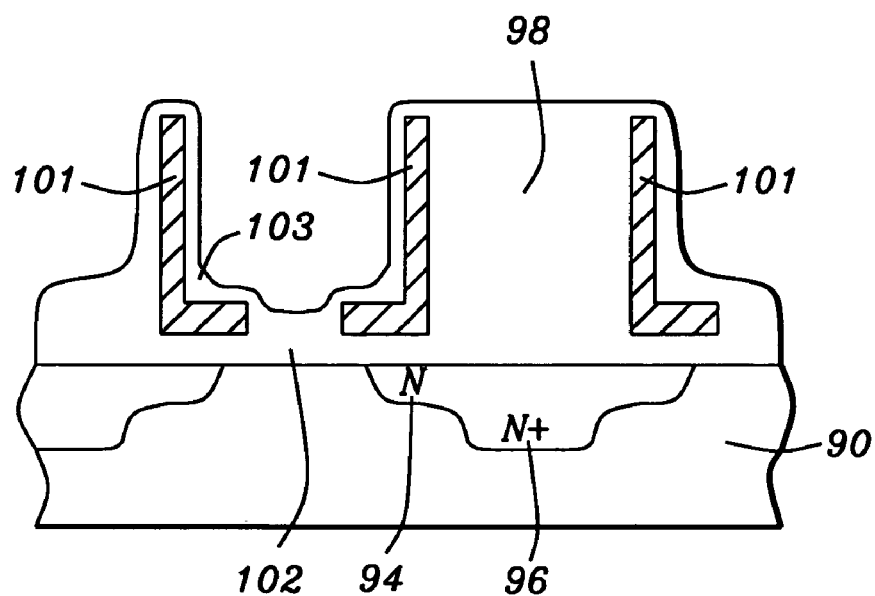
Figure 8F:
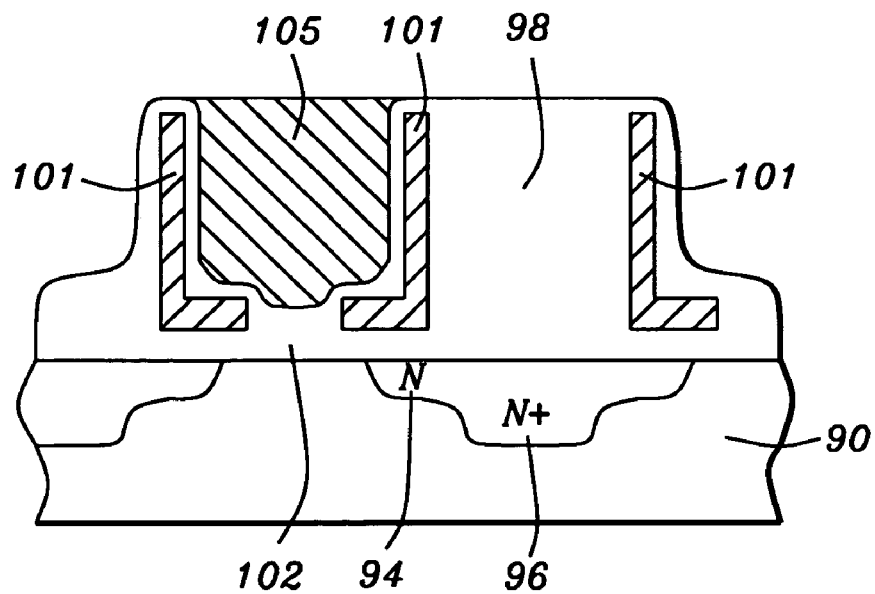

FIG. 8A, through 8F show a fabrication method for an N channel Twin MONOS memory array. In FIG. 8A a P-type silicon substrate 90 is doped with the surface concentration in the range of approximately about 5E17 to 1.5E18 atoms per $cm^3$. Shallow trench isolation (not shown) is formed in areas between columns of memory cells. Then a gate oxide 91 in the range of approximately about 2 nm to 5 nm is grown. A polysilicon layer 92 in the range of approximately between of 150 nm to 250 nm is CVD (chemical vacuum deposited) followed by a nitride deposition 93 in the range of approximately about 100 nm to 150 nm. The photo resist 89 is patterned to define areas for an N+ deposition using conventional photolithography.

Referring to FIG. 8B, the nitride and the polysilicon are etched using the photo resist 89 as a mask. Then As (arsenic) is implanted at a concentration of approximately between 3E12 and 3E13 atoms per $cm^3$ at an energy level of approximately between 15 keV and 20 keV to create a lightly doped region 94. After the lightly doped regions are implanted, an oxide layer in the range of approximately about 30 nm to 60 nm is deposited by CVD and etched vertically leaving sidewall spacers 95 having a thickness of approximately between 25 nm to 55 nm, which suppresses the out diffusion of N+ under the nitride storage region. A heavily doped N+ region 96 is implanted with As to a concentration of approximately about 1.5E15 atom per cm$^3$ at an energy level between approximately 15 keV and 25 keV.

In FIG. 8C a CVD oxide 98 in thickness in the range of approximately between 250 nm and 400 nm is deposited, and then the oxide 98 is chemically mechanically polished (CMP) to planarize the surface of the substrate, stopping at nitride 93 when the mask elements are detected. The oxide isolation layer 98 is self-aligned to the diffusions 94 and 96.

Referring to FIG. 8D, the nitride layer 93 is selectively removed, and the, polysilicon 92 is also carefully and selectively etched out by a chemical dry etch. The remaining oxide 91 of a thickness of approximately 3.0 nm is etched out. Then a fresh gate oxide 100 having a thickness of approximately between 2.5 nm and 5 nm is thermally grown followed by nitride deposition 101 to a thickness of approximately between 3 nm and 9 nm. A disposable sidewall spacer (DWS) 102 is formed on the sidewalls of the nitride 101 by depositing a spacer material to a thickness of approximately between 25 nm and 40 nm using a material such as polysilicon, BPSG (borophosphosilicate glass) or oxynitride, which can be selectively etched against the silicon oxide isolation layer 98. After the spacer 102 is etched, exposed areas of the nitride layer 101 are etched out using the DSW as the mask.

Referring to FIG. 8E, after the DSW 102 is selectively removed, the remaining nitride layer 101 and bottom silicon 100 are oxidized 103 by ISSG (InSitu Steam Generation) tool and an additional thermal oxidation is used to grow approximately between 5 nm and 6 nm on the nitride 101. A thickness of approximately between 3 nm and 4 nm of the nitride 101 is converted to a thickness of approximately between 5 nm and 6 nm of oxide. The remaining nitride thickness after ISSG oxidation is a range approximately between few atomic layers and 6 nm. The oxide is also grown on the exposed substrate silicon regions in between the L-shaped nitride pair to approximately between 8 nm and 12 nm.

Referring to FIG. 8F, a word gate polysilicon 105 of approximately about 250 nm is deposited by CVD and the polysilicon 105 is polished by CMP forming the polysilicon word gate between SiO$_2$ studs 98 over N+ region. The polygate 105 can be silicided with Cobalt or Titanium.

Figure 8G:
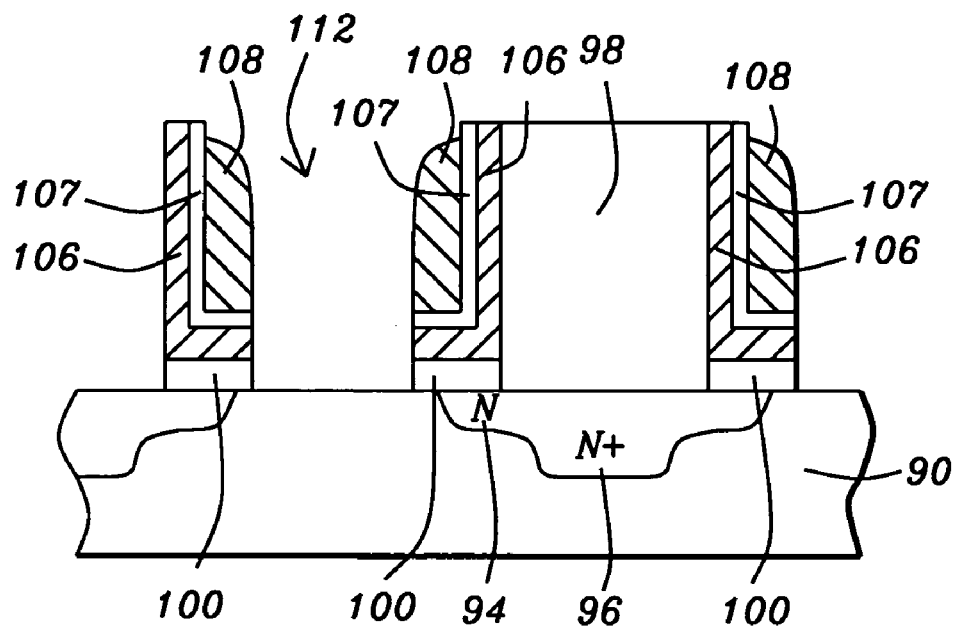
Figure 8H:
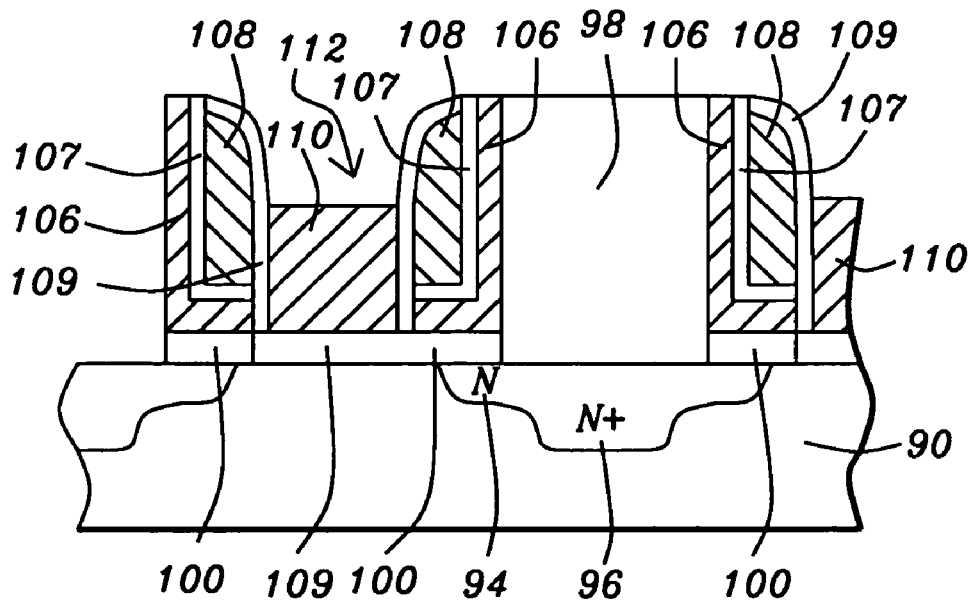
Figure 8I:
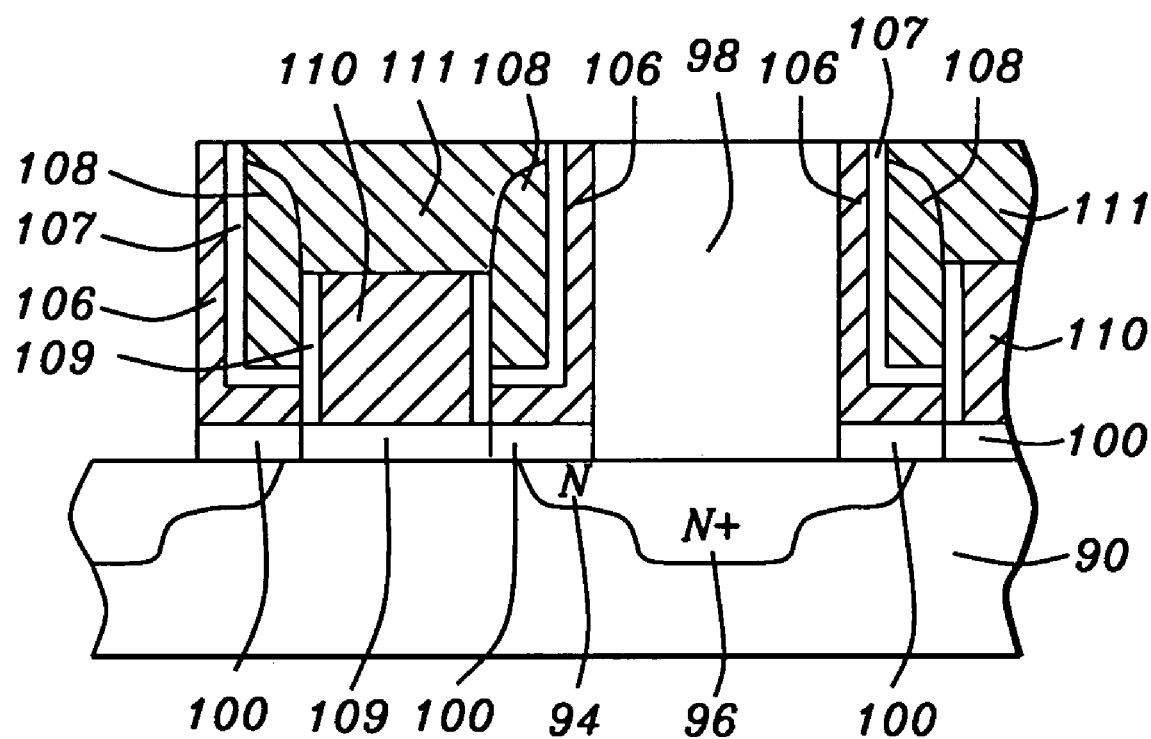

FIG. 8G through 8I show an alternative fabrication method for an N channel Twin MONOS memory array, following FIG. 8C. Referring to FIG. 8G, after the peripheral area is protected by oxide mask (not shown), the nitride layer 93 in memory area is selectively removed, and the polysilicon 92 is also carefully and selectively etched out by a chemical dry etch, the remaining oxide 91 of a thickness of approximately 3.0 nm is etched out. Then a fresh gate oxide 100 having a thickness of approximately between 2.5 nm and 5 nm is thermally grown followed by nitride deposition 106 to a thickness of approximately between few atomic layer and 9 nm. A subsequent top oxide 107 is formed to a thickness of approximately between 4 nm and 7 nm. The top oxide formation 107 can be either CVD (chemical vapor deposition) such as HTO or thermal growth with ISSG, for example. The nitride deposition thickness for thermal top oxide is carefully defined since the nitride is estimated to lose about two thirds of its thickness to the top oxide during the thermal oxidation. After oxidation the remaining nitride thickness is approximately between few atomic layers to 6 nm. The operation voltages can be reduced if the nitride is a few atomic layers. The ultra thin nitride is also applicable for any other MONOS devices. The polysilicon 108 is deposited to a thickness of approximately between 25 nm and 40 nm and vertically etched to the top oxide 107. After the polysilicon 108 is etched, the top oxide layer 107, the nitride layer 106 and the bottom oxide layer 100 in the exposed area are successively etched out using the polysilicon sidewalls 108 as the mask. This forms a void 112 between the sidewalls, which go to the surface of the substrate 90.

Referring to FIG. 8H, thermal oxide 109 having a thickness of approximately between 2.5 and 6 nm on substrate silicon is grown over exposed substrate 90, the exposed edges of the oxide 100 and 107, the exposed edge of the nitride 106 and the polysilicon sidewall 108. Another layer of polysilicon 110 is deposited to into the void 112 and then the poly silicon 110 is vertically etched to the half way height of the word gate to expose the oxide 109 on polysilicon 108. This is followed by an oxide etch to expose the polysilicon and the nitride in the logic area (not shown). Then nitride in logic area is selectively removed.

Referring to FIG. 8I, a barrier metal such as titanium nitride or tungsten 111 is deposited to connect side wall polysilicon 108 and polysilicon 110 into a word gate and to connect to agate polysilicon in the peripheral area (not shown), followed by CMP (chemical mechanical polish) to remove unnecessary tungsten. The process sequence can be shared with a contact stud process.

While the invention has been particularly shown and described with reference to preferred embodiments thereof, it will be understood by those skilled in the art that various changes in form and details may be made without departing from the spirit and scope of the invention.

What is claimed is:

1. A twin MONOS NAND memory array, comprising:
   a) an array of twin MONOS memory cells arranged in rows and columns and forming a NAND memory array,
   b) a word gate located over two storage sites of each memory cell of said memory cells,
   c) a diffusion forming a source and a drain connecting between said memory cells in a column
   d) a first selector gate located at top of a column and connected to a first memory cell in said column.
   e) a second selector gate located at a bottom of a column and connected to a last memory cell in said column.

2. The memory array of claim 1, wherein said word gate is a part of a word line, which is further a row of said word gates.

3. The memory array of claim 1, wherein said source and said drain are formed by a single diffusion located between adjacent memory cells in said column.

4. The memory array of claim 1, wherein said storage sites are nitride elements located below said word gate.

5. The memory array of claim 1, wherein said first and second selector gates select said column of memory cells to allow memory operations to be performed.

6. The memory array of claim 1, wherein said diffusions in rows are isolated from each other by a shallow trench isolation.

7. A NAND memory array using twin MONOS memory cells, comprising:
   a) a means for locating two storage sites under each word gate of a twin MONOS memory array, b) a means for connecting together said word gates in a row of said memory array,
c) a means for connecting together a plurality of memory cells in a column of said memory array, wherein said column has an upper voltage and lower voltage,
d) a means for selecting said upper voltage to be connected to said column,
e) a means for selecting said lower voltage to be connected to said column,
f) a means for performing memory operations by selecting said upper and lower voltages and by applying a plurality of voltages to the word gates of said plurality of cells in said column.

8. The memory array of claim 7, wherein said storage sites are nitride structures extending beneath said word gates.

9. The memory array of claim 7, wherein said means for connecting word gates together in a row is a word line deposited across said memory array and forming the word gates of each memory cell in said row.

10. The memory array of claim 7, wherein said means for connecting together said plurality of memory cells in a column is through a diffusion formed between each memory cell of said plurality of cells in said column.

* * * * *